United States Patent [19]

Jang et al.

[11] Patent Number: 5,726,090
[45] Date of Patent: Mar. 10, 1998

[54] GAP-FILLING OF $O_3$-TEOS FOR SHALLOW TRENCH ISOLATION

[75] Inventors: Syun-Ming Jang, Hsin-Chu; Ying-Ho Chen, Taipei; Chen-Hua Yu, Hsin-Chu, all of Taiwan

[73] Assignee: Taiwan Semiconductor Manufacturing Company, Ltd., Hsin-chu, Taiwan

[21] Appl. No.: 850,135

[22] Filed: May 1, 1997

[51] Int. Cl.$^6$ ................................................. H01L 21/76
[52] U.S. Cl. ...................... 438/435; 438/437; 438/702; 438/763; 438/789
[58] Field of Search ............................ 438/435, 437, 438/702, 763

[56] References Cited

U.S. PATENT DOCUMENTS

| 5,459,108 | 10/1995 | Doi et al. | 437/238 |
| 5,518,959 | 5/1996 | Jang et al. | 437/190 |
| 5,536,681 | 7/1996 | Jang et al. | 437/195 |
| 5,665,635 | 9/1997 | Kwon et al. | |

OTHER PUBLICATIONS

K. Kowk et al, J. Electrochem. Soc., "Surface Related Phenomena in Integrated PECVD/Ozone–TEOS SACVD Process for Sub–Half Micron Gap Fill: Electrostatic Effects", vol. 141, No. 8, Aug. 1994.

*Primary Examiner*—George R. Fourson
*Attorney, Agent, or Firm*—George O. Saile; Stephen B. Ackerman; Rosemary L. S. Pike

[57] ABSTRACT

An improved method of gap filling shallow trench isolation with ozone-TEOS is described. A pad oxide layer is provided over the surface of a semiconductor substrate. A nitride layer is deposited overlying the pad oxide layer. A plurality of isolation trenches is etched through the nitride and pad oxide layers into the semiconductor substrate. A thermal oxide layer is grown within the isolation trenches. A plasma enhanced $SiH_4$ oxide layer is deposited over the nitride layer and over the thermal oxide layer within the isolation trenches and treated with $N_2$ plasma. Thereafter, an ozone-TEOS layer is deposited overlying the plasma enhanced $SiH_4$ oxide layer and filling the isolation trenches. The ozone-TEOS layer and the plasma enhanced $SiH_4$ oxide layer are polished away stopping at the nitride layer. This completes the formation of shallow trench isolation in the fabrication of the integrated circuit device.

23 Claims, 5 Drawing Sheets

GAP-FILLING OF $O_3$-TEOS FOR SHALLOW TRENCH ISOLATION

BACKGROUND OF THE INVENTION

1. Field of the Invention

The present invention relates to the fabrication of integrated circuit devices, and more particularly, to a method of improving the gap filling characteristics of an ozone-TEOS shallow trench isolation layer in the fabrication of integrated circuits.

2. Description of the Prior Art

Shallow trench isolation (STI) has been gaining popularity for quarter-micron technology and beyond to replace the traditional local oxidation of silicon (LOCOS) isolation process. However, as the design rule continues to shrink, gap filling of the smaller trench becomes a great challenge. Currently, both ozone-TEOS (tetraethoxysilane) and high density plasma chemical vapor deposited (HDPCVD) oxide are being studied extensively for STI gap filling. For the $O_3$-TEOS approach, surface sensitivity of subatmospheric chemical vapor deposited (SACVD) $O_3$-TEOS oxide on thermal oxide is the most critical issue. An underlayer of thermal oxide is desired for good sidewall isolation. However, the surface sensitivity of $O_3$-TEOS deposition over thermal oxide results in a degradation of the $O_3$-TEOS deposition rate and wet etch rate. This problem is discussed in the paper, "Surface Related Phenomena in Integrated PECVD/Ozone-TEOS SACVD Processes for Sub-Half Micron Gap Fill: Electrostatic Effects," by K. Kwok et al, *J. Electrochem. Soc.*, Vol. 141, No. 8, August 1994. Traditional methods to eliminate surface sensitivity include the use of Ar or $N_2$ plasma treatment on the underlayer and power ramp-down deposition of a PE-TEOS (plasma-enhanced) underlayer. However, we have found that these methods do not provide an acceptable solution because of severe surface porosity of these underlayers.

U.S. Pat. No. 5,536,681 to Jang et al teaches a method to improve the gap-filling capability of ozone-TEOS over metal lines by selectively treating with $N_2$ plasma portions of an underlayer overlying the metal lines. This selective treatment leads to differing deposition rates on the top of the metal lines and on the bottom and sidewalls of the gaps to improve the gap filling characteristics of the ozone-TEOS. U.S. Pat. No. 5,518,959 to Jang et al teaches a method of selectively depositing an oxide layer using a PE-OX layer with a selectively deposited $O_3$-TEOS layer. U.S. Pat. No. 5,459,108 to Doi et al teaches a method of forming an oxide layer using $O_3$-TEOS with $N_2$ added to the deposition gases in order to decrease the moisture content of the resulting film. The paper of Kwok et al, cited above, discusses using an $N_2$ plasma treatment of a PE-TEOS underlayer, but finds underlayers of PE-$SiH_4$ or TEOS-$N_2O$ to be adequate without plasma treatment.

SUMMARY OF THE INVENTION

Accordingly, it is a primary object of the invention to provide a process for improving the gap filling characteristics of $O_3$-TEOS in shallow trench isolation in the fabrication of integrated circuits.

It is a further object of the invention to provide a process for improving the step coverage of ozone-TEOS in shallow trench isolation.

It is yet another object to provide a process for improving the step coverage of ozone-TEOS by forming a PE-OX underlayer with $N_2$ treatment for shallow trench isolation.

It is a still further object of the invention to provide a process for improving step coverage of ozone-TEOS for shallow trench isolation by forming an underlayer wherein the surface of the underlayer maintains smoothness.

In accordance with the objects of the invention, an improved method of gap filling shallow trench isolation with ozone-TEOS is achieved. A pad oxide layer is provided over the surface of a semiconductor substrate. A nitride layer is deposited overlying the pad oxide layer. A plurality of isolation trenches is etched through the nitride and pad oxide layers into the semiconductor substrate. A thermal oxide layer is grown within the isolation trenches. A plasma enhanced $SiH_4$ oxide layer is deposited over the nitride layer and over the thermal oxide layer within the isolation trenches and treated with $N_2$ plasma. Thereafter, an ozone-TEOS layer is deposited overlying the plasma enhanced $SiH_4$ oxide layer and filling the isolation trenches. The ozone-TEOS layer and the plasma enhanced $SiH_4$ oxide layer are polished away stopping at the nitride layer. This completes the formation of shallow trench isolation in the fabrication of the integrated circuit device.

BRIEF DESCRIPTION OF THE DRAWINGS

In the accompanying drawings forming a material part of this description, there is shown:

FIGS. 1–8 are cross-sectional representations of a preferred embodiment of the present invention.

FIG. 9 is a cross-sectional representation of a shallow isolation trench of the prior art.

FIG. 10 is a cross-sectional representation of a completed integrated circuit device fabricated according to the process of the present invention.

DESCRIPTION OF THE PREFERRED EMBODIMENTS

Referring now more particularly to FIG. 1, there is shown a semiconductor substrate 10, preferably of monocrystalline silicon. Shallow trench isolation regions are to be formed in the semiconductor substrate to isolate active areas of the integrated circuit device from one another. A layer of pad oxide 12 is grown on the surface of the substrate. A layer of silicon nitride 14 is deposited over the pad oxide layer.

Referring now to FIG. 2, shallow trenches are etched into the silicon substrate using conventional photolithography and etching techniques. The shallow trenches 16 may be as small as 0.35 microns in width and are etched to a depth of between about 3000 and 5000 Angstroms.

A thermal oxide layer 17 is grown on the sidewalls of the trench 16 to a thickness of about 350 Angstroms, as depicted in FIG. 3. This thermal oxide provides a good sidewall isolation.

Now the trenches are to be filled with a dielectric material. The trenches will be filled with ozone-TEOS. First, an underlayer is to be deposited within the trenches to eliminate surface sensitivity and to eliminate the deleterious effects of the thermal oxide underlayer on $O_3$-TEOS deposition and wet etch rates.

In the paper by Kwok et al, cited above, the authors find that an underlayer of PE-$SiH_4$ oxide does not adversely effect deposition or wet etch rates of the overlying $O_3$-TEOS layer for gap filling of metal lines. However, the inventors of the present invention have found that even a PE-$SiH_4$ oxide underlayer causes problems for the shallow trench isolation application.

We have tried various plasma-enhanced chemical vapor deposited (PECVD) oxides followed by plasma treatment to form the underlayer. We have found that the best results occur when PE-SiH$_4$ is deposited together with an N$_2$ plasma treatment.

Figure 1:
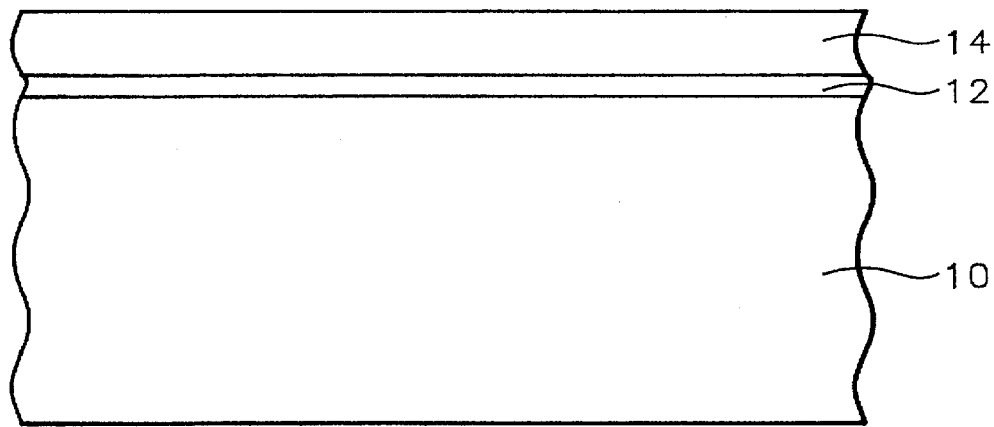
Figure 2:
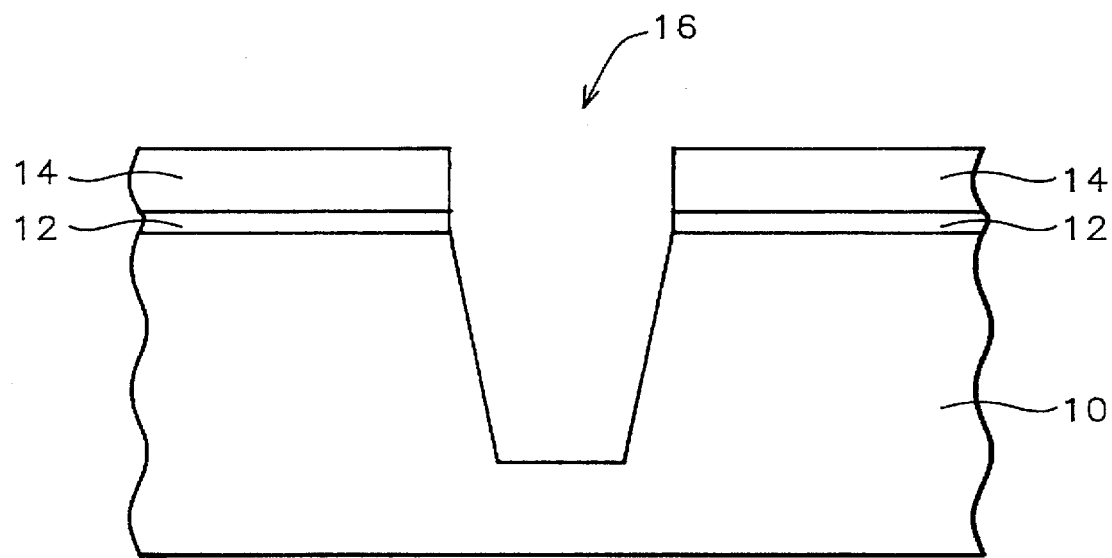
Figure 3:
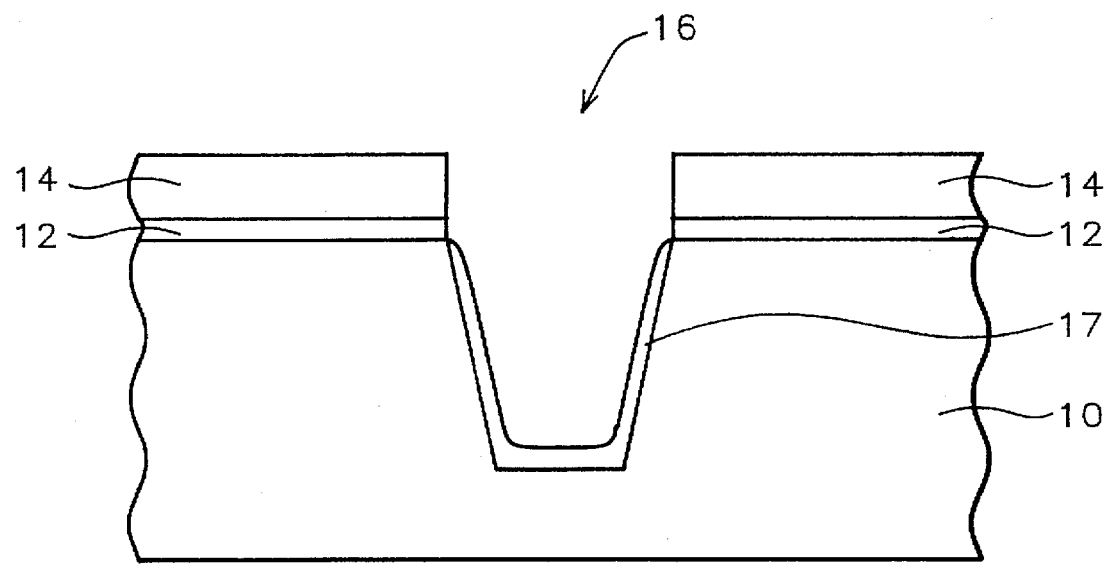
Figure 4:
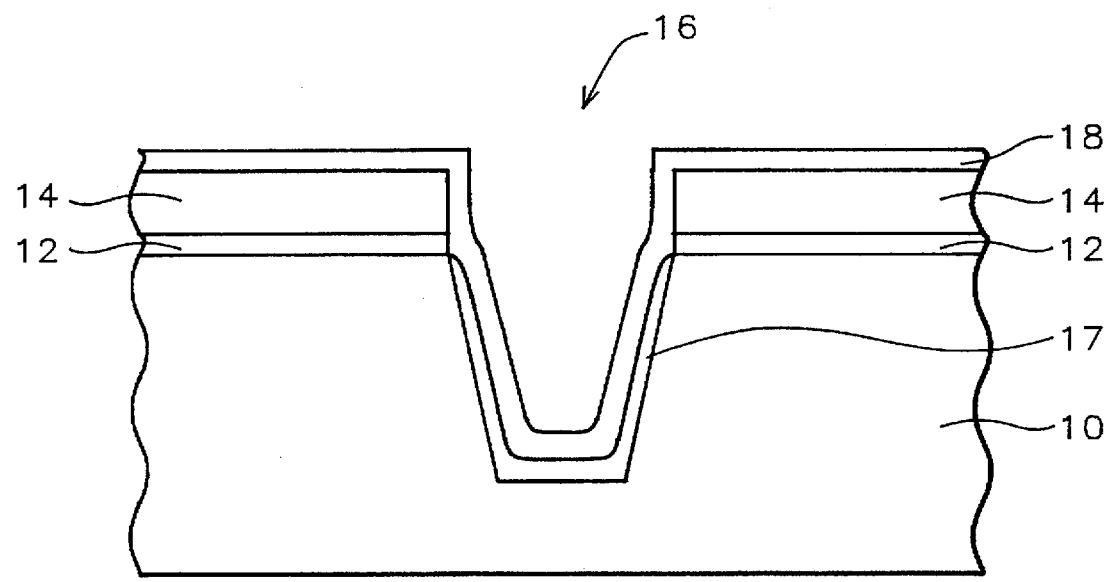

Referring to FIG. 4, a layer of plasma-enhanced silane oxide SiH$_4$ 18 is deposited by plasma enhanced chemical vapor deposition (PECVD) over the surface of the substrate and within the trenches 16. This layer will be referred to henceforth as the PE-OX underlayer. The PE-OX underlayer is deposited to a thickness of between about 350 and 600 Angstroms. The sidewall and bottom step coverage of the PE-OX is between about 20% to 30%.

Figure 5:
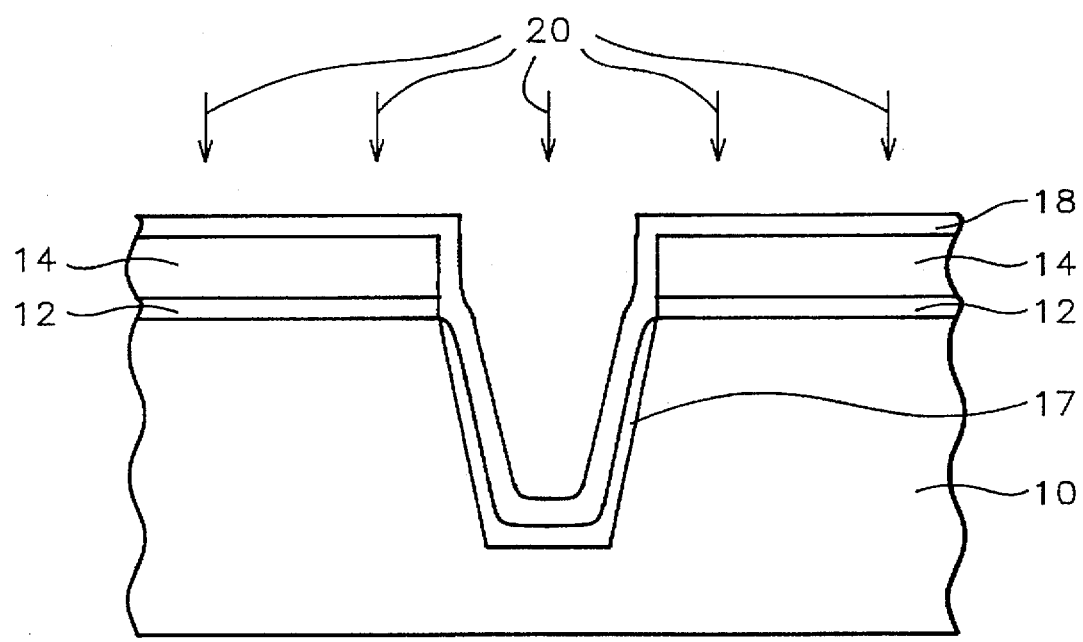

After the PE-OX deposition, the N$_2$ plasma treatment 20 is performed, as shown in FIG. 5. N$_2$ gas is flowed at between about 400 to 600 sccm and Helium is flowed at between 1800 to 2200 sccm at a pressure of between about 1 to 2 Torr for between about 50 to 70 seconds. It is expected that Argon gas could be used in place of the nitrogen gas with similar effect.

Figure 6:
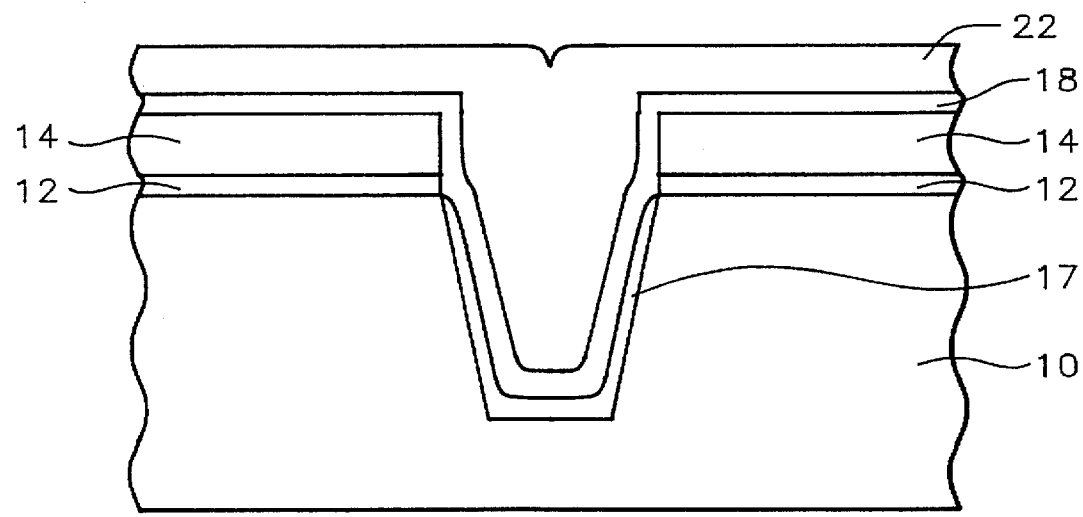

Referring now to FIG. 6, a layer of O$_3$-TEOS 22 is deposited overlying the PE-OX underlayer. The ozone-TEOS layer 22 is deposited overlying the PE-OX layer 18 by subatmospheric chemical vapor deposition to a thickness of between about 5000 and 7000 Angstroms. The bottom and sidewall step coverage of the O$_3$-TEOS layer will be 100%. The ozone-TEOS layer also has some flow characteristics. No voids are formed within the layer 22 because of the complete gap filling.

The process of the invention results in voidless gap filling of ozone-TEOS in the shallow isolation trenches down to 0.35 microns in width. A great improvement in surface morphology is also seen.

Figure 7:
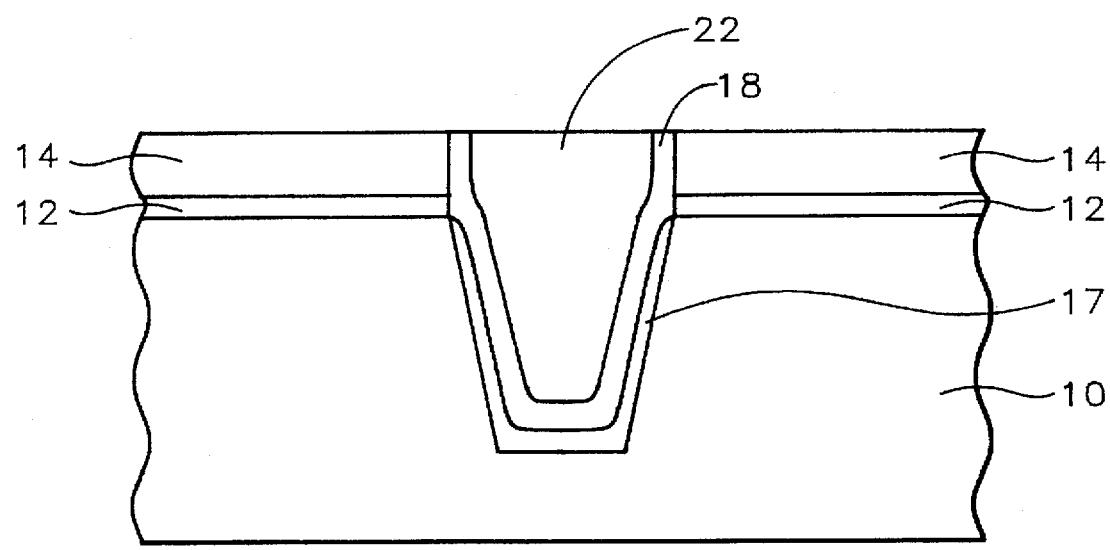

Referring now to FIG. 7, the ozone-TEOS layer 22 and the PE-OX layer 18 above the level of the trenches are removed, for example, by chemical mechanical polishing (CMP).

Figure 8:
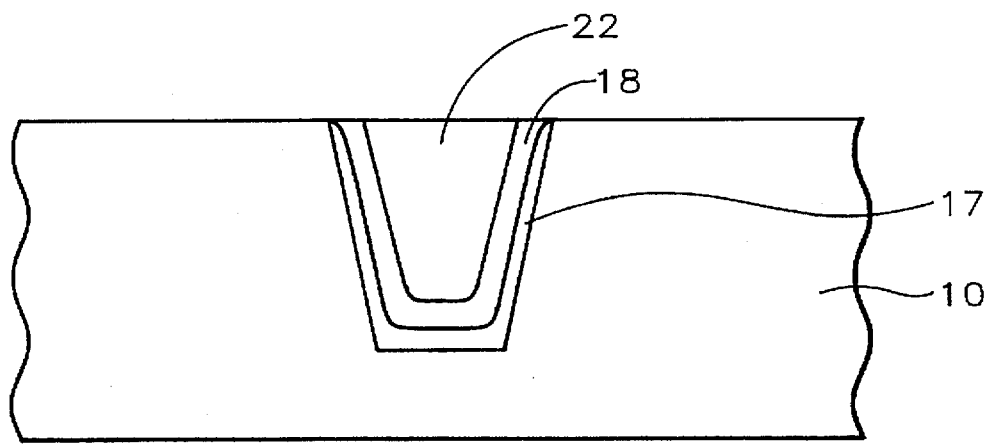

The silicon nitride is etched away and the pad oxide is removed using wet etching or dipping. These wet dips and pre-gate oxide cleaning can attack the ozone-TEOS surface. In some approaches, porosity appears in the ozone-TEOS surface. However, in the process of the present invention, the surface is still smooth after these steps. This completes the formation of the shallow trench isolation, as illustrated in FIG. 8.

Figure 10:
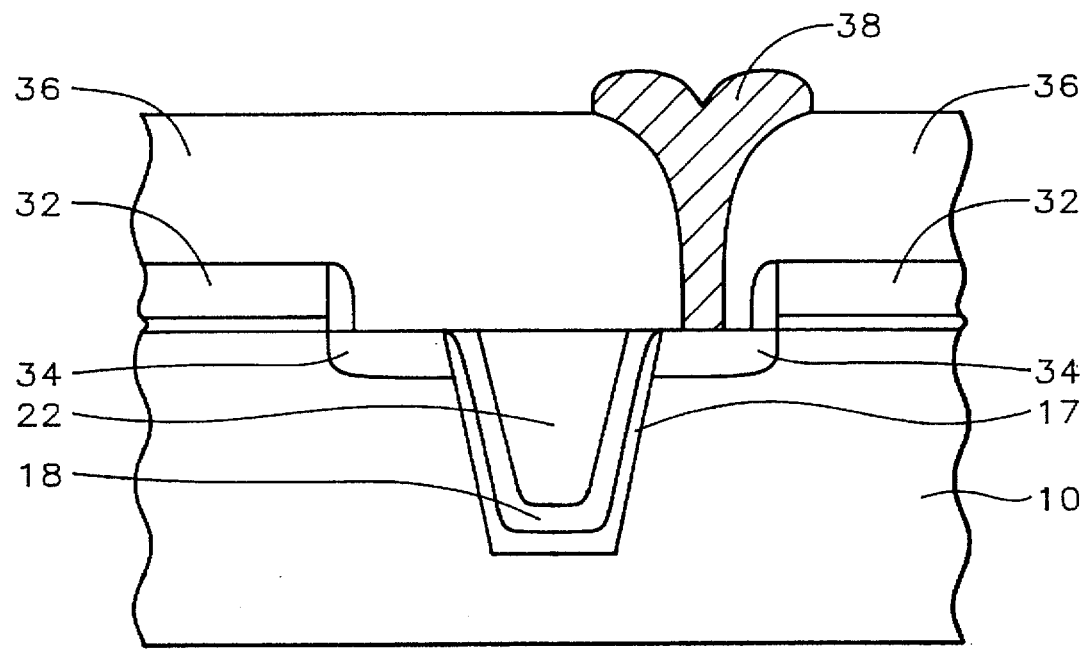

Semiconductor device structures, including gate electrodes 32 and source and drain regions 34 may be formed as is conventional in the art. Electrical contacts 38 may be made through dielectric isolation layer 36, as shown in FIG. 10.

EXAMPLE

The following Example is given to show the important features of the invention and to aid the understanding thereof. Variations may be made by one skilled in the art without departing from the spirit and scope of the invention.

Experiments were performed to fill a STI trench using SACVD O$_3$-TEOS. In sample 1, there was no underlayer. The O$_3$-TEOS was deposited directly overlying the thermal oxide layer. In sample 2, the thermal oxide layer was treated with N$_2$ plasma for one minute, then O$_3$-TEOS was deposited. In the remaining samples 3–7, various underlayers were deposited over the thermal oxide layer before the deposition of O$_3$-TEOS. The following table details the underlayers tested and shows the results of the experiments. Trench bulk refers to the gap filling quality of the O$_3$-TEOS filling after all wet dips have been performed (that is, wet dips to remove the silicon nitride and pad oxide and to clean the surface).

TABLE 1

| Sample | Underlayer or treatment | Trench bulk | Trench sidewall |
| --- | --- | --- | --- |
| 1 | None | No dep | severe porosity |
| 2 | N$_2$ treatment 1 min. | seamless | severe porosity |
| 3 | 1000A 60 Torr O$_3$-TEOS | seamless | clean but recess |
| 4 | 500–1500A PE-OX | voiding | clean |
| 5 | 500–1500A DEL-TEOS + N$_2$ treatment 1 min. | seamless | severe porosity |
| 6 | 500–1500A PE-TEOS + N$_2$ treatment 1 min. | seamless | severe porosity |
| 7 | 500–1500A PE-OX + N$_2$ treatment 1 min. | seamless | little porosity |

The experiments included conventional furnace densification after the O$_3$-TEOS deposition to improve the quality of the O$_3$-TEOS film. For samples 2 and 3, the furnace densification was performed at 1000° C. for 30 minutes. For samples 4–7, the densification was performed at 1000°–1100° C. for two hours.

It can be seen from the table above that a seamless gap filling of the trench was achieved in all the methods accept the first sample in which a negligible amount of O$_3$-TEOS was deposited because of the very low deposition rate over thermal oxide and the fourth sample in which voiding occurred. Note that the fourth sample uses an underlayer of PE-OX, which is the PE-SiH$_4$ underlayer of the present invention but without the N$_2$ treatment.

Samples 5–7 used a nitrogen treatment of the underlayers. Sample 5 had an underlayer of dual-frequency TEOS, sample 6 had an underlayer of PE-TEOS, and sample 7 had a underlayer of PE-OX; that is, the PE-SiH$_4$ underlayer of the present invention.

Figure 9:
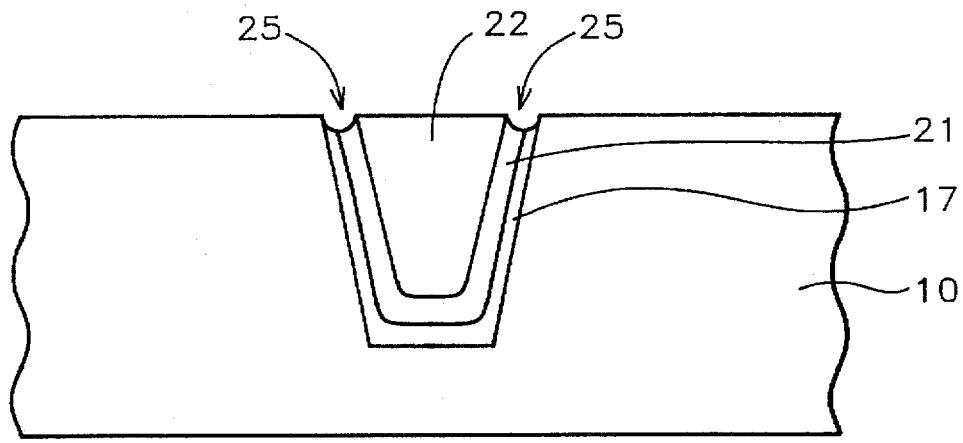

FIG. 9 illustrates the sample 3 after polishing and wet dips. The trench is filled without voids. However, the O$_3$-TEOS underlayer 21 has a high wet etch rate. This causes recessing 25 of the underlayer during polishing and wet dips to complete the STI which exposes the silicon and may cause a leakage problem.

Only in sample 7, using the process of the present invention, was seamless gap filling along with little sidewall porosity achieved.

For shallow trench isolation, good gap filling is not the only criterion for choosing an underlayer for O$_3$-TEOS. The underlayer must also be able to withstand the polishing, wet etching, and wet dipping performed to complete the shallow trench isolation and to prepare the surface for the formation of gate electrodes and other devices. The process of the present invention uses an underlayer of PE-SiH$_4$ treated with N$_2$ plasma to provide for seamless gap filling and a smooth surface for shallow trench isolation.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing a pad oxide layer over the surface of a semiconductor substrate;

depositing a nitride layer overlying said pad oxide layer;

etching a plurality of isolation trenches through said nitride and said pad oxide layers into said semiconductor substrate;

depositing a plasma enhanced SiH$_4$ oxide layer over said nitride layer and within said isolation trenches and treating said plasma enhanced SiH$_4$ oxide layer with N$_2$ plasma;

thereafter depositing an ozone-TEOS layer overlying said plasma enhanced SiH$_4$ oxide layer and filling said isolation trenches;

polishing away said ozone-TEOS layer and said plasma enhanced SiH$_4$ oxide layer stopping at said silicon nitride layer; and completing the fabrication of said integrated circuit device.

2. The method according to claim 1 further comprising growing a thermal oxide layer within said isolation trenches before said depositing of said plasma enhanced SiH$_4$ oxide layer.

3. The method according to claim 2 wherein said thermal oxide layer has a thickness of about 350 Angstroms.

4. The method according to claim 1 wherein said plasma enhanced SiH$_4$ oxide layer is deposited to a thickness of between about 350 and 600 Angstroms.

5. The method according to claim 1 wherein said N$_2$ plasma treatment comprises flowing N$_2$ gas at 400 to 600 sccm and flowing helium at 1800 to 2200 sccm at a pressure of 1 to 2 Torr for 50 to 70 seconds.

6. The method according to claim 1 wherein said width of said isolation trenches is as small as 0.35 microns.

7. The method according to claim 1 wherein said polishing is done by chemical mechanical polishing.

8. The method according to claim 1 wherein said isolation trenches are completely filled with said ozone-TEOS layer and wherein no voids are formed within said ozone-TEOS layer.

9. The method according to claim 1 wherein said completing fabrication of said integrated circuit device comprises:

etching away said silicon nitride layer;

removing said pad oxide layer; and fabricating semiconductor device structures in and on said semiconductor substrate between said isolation trenches.

10. A method of forming shallow trench isolation in the manufacture an integrated circuit device comprising:

providing a pad oxide layer over the surface of a semiconductor substrate;

depositing a nitride layer overlying said pad oxide layer;

etching a plurality of isolation trenches through said nitride and said pad oxide layers into said semiconductor substrate;

depositing a plasma enhanced SiH$_4$ oxide layer over said nitride layer and within said isolation trenches and treating said plasma enhanced SiH$_4$ oxide layer with N$_2$ plasma;

thereafter depositing an ozone-TEOS layer overlying said plasma enhanced SiH$_4$ oxide layer and filling said isolation trenches;

polishing away said ozone-TEOS layer and said plasma enhanced SiH$_4$ oxide layer stopping at said silicon nitride layer;

etching away said nitride layer; and removing said pad oxide layer to complete said formation of said shallow trench isolation in the fabrication of said integrated circuit device.

11. The method according to claim 10 further comprising growing a thermal oxide layer within said isolation trenches before said depositing of said plasma enhanced SiH$_4$ oxide layer.

12. The method according to claim 11 wherein said thermal oxide layer has a thickness of about 350 Angstroms.

13. The method according to claim 10 wherein said plasma enhanced SiH$_4$ oxide layer is deposited to a thickness of between about 350 and 600 Angstroms.

14. The method according to claim 10 wherein said N$_2$ plasma treatment comprises flowing N$_2$ gas at 400 to 600 sccm and flowing helium at 1800 to 2200 sccm at a pressure of 1 to 2 Torr for 50 to 70 seconds.

15. The method according to claim 10 wherein said width of said isolation trenches is as small as 0.35 microns.

16. The method according to claim 10 wherein said polishing is done by chemical mechanical polishing.

17. The method according to claim 10 wherein said isolation trenches are completely filled with said ozone-TEOS layer and wherein no voids are formed within said ozone-TEOS layer.

18. The method according to claim 10 wherein said completed shallow trench isolation has a smooth surface.

19. A method of manufacturing an integrated circuit device comprising:

providing a pad oxide layer over the surface of a semiconductor substrate;

depositing a nitride layer overlying said pad oxide layer;

etching a plurality of isolation trenches through said nitride and said pad oxide layers into said semiconductor substrate;

growing a thermal oxide layer within said isolation trenches;

depositing a plasma enhanced SiH$_4$ oxide layer overlying said nitride layer and overlying said thermal oxide layer within said isolation trenches and treating said plasma enhanced SiH$_4$ oxide layer with N$_2$ plasma;

thereafter depositing an ozone-TEOS layer overlying said plasma enhanced SiH$_4$ oxide layer and filling said isolation trenches;

polishing away said ozone-TEOS layer and said plasma enhanced SiH$_4$ oxide layer stopping at said silicon nitride layer;

etching away said nitride layer;

removing said pad oxide layer; and completing the fabrication of said integrated circuit device.

20. The method according to claim 19 wherein said N$_2$ plasma treatment comprises flowing N$_2$ gas at 400 to 600 sccm and flowing helium at 1800 to 2200 sccm at a pressure of 1 to 2 Torr for 50 to 70 seconds.

21. The method according to claim 19 wherein said width of said isolation trenches is as small as 0.35 microns.

22. The method according to claim 19 wherein said isolation trenches are completely filled with said ozone-TEOS layer and wherein no voids are formed within said ozone-TEOS layer.

23. The method according to claim 19 wherein said completing fabrication of said integrated circuit device comprises fabricating semiconductor device structures including gate electrodes and source and drain regions and electrical connections between said device structures in and on said semiconductor substrate between said isolation trenches.

* * * * *